(12) United States Patent
Yamamoto et al.

(10) Patent No.: US 6,423,593 B1
(45) Date of Patent: Jul. 23, 2002

(54) SEMICONDUCTOR INTEGRATED CIRCUIT DEVICE AND PROCESS FOR MANUFACTURING THE SAME

(75) Inventors: Satoshi Yamamoto, Ome; Shinpei Iijima, Akishima, both of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/943,516

(22) Filed: Aug. 31, 2001

(30) Foreign Application Priority Data

Oct. 23, 2000 (JP) ........................................ 2000-322117

(51) Int. Cl.[7] .......................................... H01L 21/8242
(52) U.S. Cl. ....................... 438/240; 438/313; 438/330; 438/238
(58) Field of Search ................................ 438/240, 313, 438/330, 328, 713, 238, 241, 253, 622, 666, 791, 624, 631; 257/310, 303, 304, 301, 295

(56) References Cited

U.S. PATENT DOCUMENTS 5,973,351 A * 10/1999 Kotecki et al. ............. 257/310
6,057,081 A * 5/2000 Yunogami et al. .......... 430/313
6,215,144 B1 * 4/2001 Saito et al. ................. 257/310
6,235,572 B1 * 5/2001 Kunitono et al. ........... 438/240
6,258,649 B1 * 7/2001 Nakamura et al. .......... 438/238
6,326,218 B1 * 12/2001 Yunogami et al. ............. 438/3

* cited by examiner

Primary Examiner—Olik Chaudhuri
Assistant Examiner—Laura M Schillinger
(74) Attorney, Agent, or Firm—Antonelli, Terry, Stout & Kraus, LLP

(57) ABSTRACT

There is provided a technique for forming an Ru film on the bottom of a deep hole with a considerable film thickness for the lower electrode of an information storage capacity element in order to improve the yield of manufacturing DRAMs. The Ru film is formed on the side wall and the bottom of a deep hole as material for preparing the lower electrode of an information storage capacity element to be produced there under the condition of a gasification flow rate ratio of the raw materials $((Ru(C_2H_5C_5H_4)_2/O_2)$ is not less than 10%. Then, the ratio of the film thickness of the Ru film on the bottom "b" of the hole to the largest film thickness "a" of the Ru film in the hole is not less than 50%.

2 Claims, 19 Drawing Sheets

US 6,423,593 B1

SEMICONDUCTOR INTEGRATED CIRCUIT DEVICE AND PROCESS FOR MANUFACTURING THE SAME

TECHNICAL FIELD OF THE INVENTION

This invention relates to a semiconductor integrated circuit device and a process for manufacturing the same. More particularly, the present invention relates to a technique that can be effectively applied to a structure comprising an insulating film having a hole (recess) and a metal film formed in the hole and containing Ru (ruthenium) as principal ingredient and also to a process for manufacturing such a structure.

BACKGROUND OF THE INVENTION

A DRAM comprises a MISFET for memory cell selection and an information storage capacity element connected in series to the MISFET. The information storage capacity element is typically formed by sequentially depositing silicon for forming a lower electrode, tantalum oxide for forming a capacity insulating film and silicon for forming an upper electrode.

The information storage capacity element is formed in a deep hole that is formed in insulating film in order to downsize the element and, at the same time, secure a certain degree of capacity.

SUMMARY OF THE INVENTION

However, when silicon is used for the lower electrode, a silicon oxide nitride film is formed along the interface of the silicon and the oxide tantalum deposited thereon in the heat treatment process conducted (at 800° C. for 3 minutes in an oxidizing atmosphere) for the purpose of crystallizing and improving the film quality of the tantalum oxide. Therefore, while the tantalum oxide and the silicon oxide nitride film operate as dielectric to suppress any possible leak currents, it is difficult to make them show a high dielectric constant.

Additionally, as device is down-sized, the hole for forming the information storage capacity element also needs to be down-sized and eventually the undulations of crystallized silicon on the wall of the hole come to contact each other so as to eliminate any room for forming upper film layers such as the tantalum oxide film.

The inventors of the present invention have been engaged in research and development for materials that can be used for the lower electrode of an information storage capacity element. They are currently looking into the feasibility of using ruthenium (Ru) for the lower electrode in order to dissolve the above identified problems.

Ru does not form a low dielectric constant film such as oxide nitride film and can be used to form a thin film because it is metal.

However, in an experiment using an Ru film for the lower electrode, there appeared a phenomenon where the film thickness was large in an upper part of the side wall of the hole and was small on the bottom of the hole as shown in FIG. 25A. When such an Ru film is subjected to heat-treatment to improve the density thereof, the thin Ru film on the bottom of the hole can agglomerate to produce islands of Ru (FIG. 25B). Then, the Ru film is discontinued and can no longer operate as lower electrode.

On the other hand, when the Ru film on the bottom of the hole is made to show a large film thickness in order to secure the continuity thereof, the Ru film in the upper part of the side wall of the hole is increased accordingly until it contact itself to eliminate any room for forming upper film layers including a tantalum oxide film (FIG. 26).

Thus, it is an object of the present invention to provide a technique with which an Ru film can be formed effectively and efficiently in a hole for the lower electrode of an information storage capacity element.

Another object of the invention is to provide a technique with which a desired Ru film can be formed to improve the performance of an information storage capacity element.

These and other objects and the novel features of the present invention will become apparent from the following description made by referring to the accompanying drawings.

In an aspect of the invention, there is provided a process for manufacturing a semiconductor integrated circuit device comprising:
  (a) a step of forming a MISFET for memory cell selection on the main surface of a semiconductor substrate;
  (b) a step of forming a plug electrically connected to the source/drain region of said MISFET for memory cell selection;
  (c) a step of forming a silicon oxide film on said plug;
  (d) a step of forming a hole getting to the surface of said plug in said silicon oxide film;
  (e) a step of forming an Ru film on the side wall and the bottom of said hole by causing an organic compound of Ru and an oxidizing agent, the gasification flow rate of the organic compound of Ru being not less than 5% of the flow rate of the oxidizing agent;
  (f) a step of forming a capacity insulating film on said Ru film; and
  (g) a step of forming an upper electrode on said capacity insulating film.

Preferably, the reaction of said organic compound of Ru and said oxidizing agent is conducted at temperature not higher than 300° C.

In another aspect of the invention, there is provided a semiconductor integrated circuit device comprising:
  (a) a MISFET for memory cell selection formed on the main surface of a semiconductor substrate;
  (b) a plug electrically connected to the source/drain region of said MISFET for memory cell selection;
  (c) a silicon oxide film formed on said plug;
  (d) a hole formed in said silicon oxide film and extending to the surface of said plug; said hole having a depth not less than five times of the short diameter thereof;
  (e) a information storage capacity element comprises an Ru film formed in said hole, a capacity insulating film formed in on the Ru film and an upper electrode formed on the capacity insulating film;
  the film thickness of the Ru film on the bottom of the hole being not less than 50% of the largest film thickness thereof in the hole.

Preferably, said hole has a depth of about 250 nm.

Preferably, an adhesive layer is formed between said Ru film and said silicon oxide film.

Preferably, said adhesive layer is made of tantalum oxide.

Preferably, the surface undulations of said Ru film are not greater than 5 nm.

DESCRIPTION OF THE PREFERRED EMBODIMENTS

Now, the present invention will be described by referring to the accompanying drawings that illustrate preferred embodiments of the invention. Throughout the drawings, components that are functionally similar to each other are denoted by a same reference symbol and will not be described repeatedly.

(Embodiment 1)

This embodiment of process for manufacturing a DRAM will be described on a step by step basis by referring to FIGS. 1 through 17.

Figure 1:
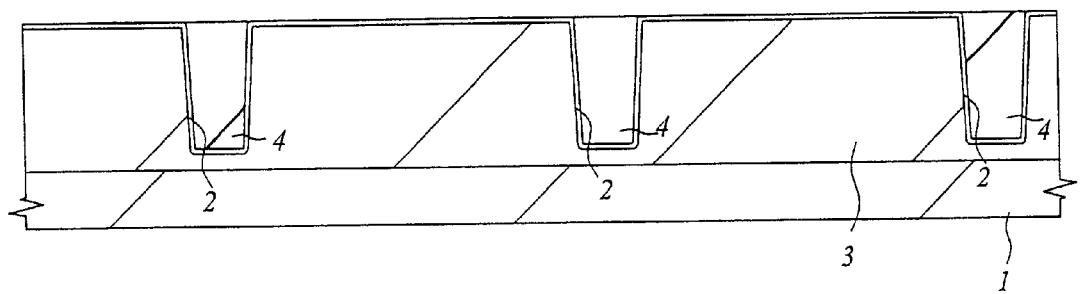
FIG. 1 is a schematic cross sectional view of a principal part of a semiconductor substrate, illustrating a step of the first embodiment of process for manufacturing a semiconductor integrated circuit device according to the invention.
Figure 2:
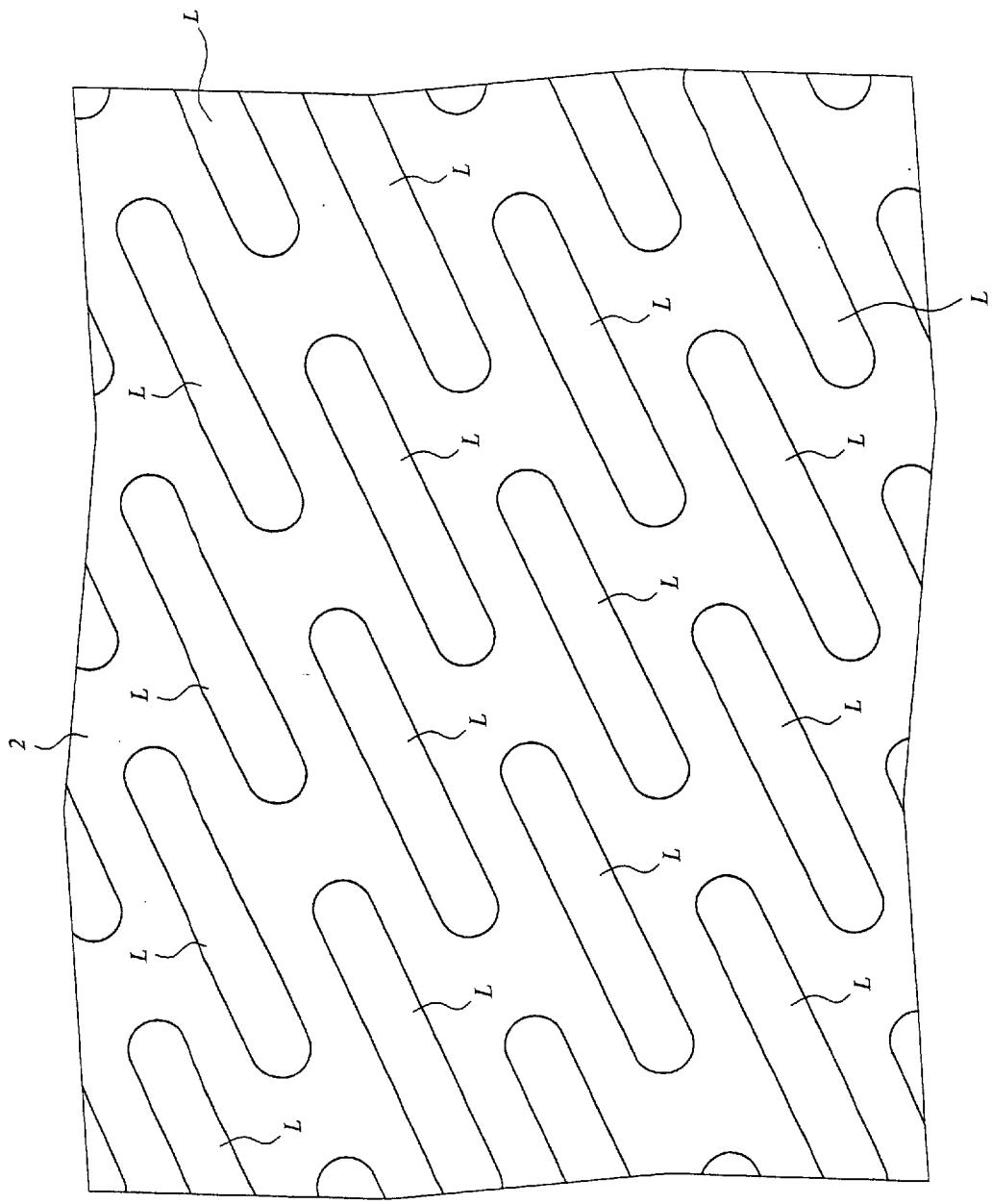
FIG. 2 is a schematic plan view of a principal part of a semiconductor substrate, also illustrating the first embodiment of process for manufacturing a semiconductor integrated circuit device according to the invention.

For each element, firstly an isolation 2 is formed in the element separating region on the main surface of a semiconductor substrate (wafer) 1 that may typically be made of p-type single crystal silicon as shown in FIG. 1. Then, as shown in FIG. 2, oblong island-like active regions (L) surrounded by the isolation 2 are produced simultaneously with the formation of the isolation 2. Thereafter, a pair of MISFET Qs for memory cell selection that share either a source or a drain are formed in each of the active regions (L).

The isolation 2 is produced by etching the surface of the semiconductor substrate 1 and forming about 300 to 400 nm deep grooves there. Subsequently, a silicon oxide film 4 (about 600 nm thick) is formed on the semiconductor substrate 1 including inside of the groove by deposition, using a CVD (Chemical Vapor Deposition) technique and then the formed silicon oxide film 4 is polished back by Chemical Mechanical Polishing (CMP) technique.

Thereafter, a p-type well 3 is formed for each element in the semiconductor substrate 1 by implanting boron (B). After cleansing the surface of the p-type well 3 by means of a hydrofluoric acid type cleansing solution, an about 6 nm thick gate insulating film 5 is formed on the surface of the p-type well 3 (active region L) by thermally oxidizing the semiconductor substrate 1.

Figure 3:
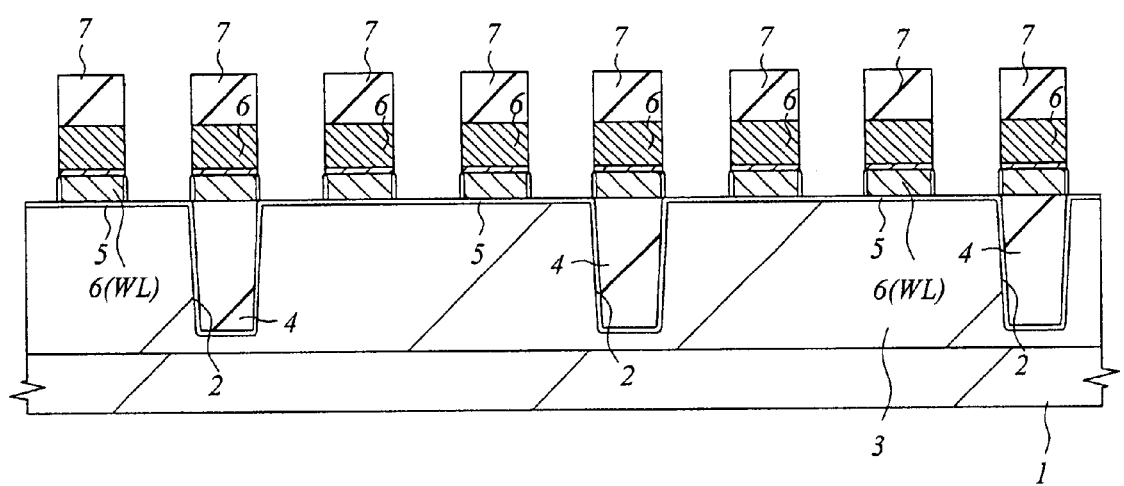
FIG. 3 is a schematic cross sectional view of a principal part of a semiconductor substrate, illustrating another step of the first embodiment of process for manufacturing a semiconductor integrated circuit device according to the invention.

Then, as shown in FIG. 3, a gate electrode 6 is formed for each element on the gate insulating film 5. More specifically, the gate electrode 6 is produced by sequentially depositing an n-type polycrystalline silicon film (about 70 nm thick) typically doped with phosphor (P), a barrier metal film (about 5 to 10 nm thick) of WN (tungsten nitride) or TiN (titanium nitride), a W film (about 100 nm thick) and a silicon nitride film 7 (about 150 nm thick) on the gate insulating film 5 and dry-etching these films, using a photoresist film as mask. The polycrystalline silicon film and the silicon nitride film 7 are deposited by CVD, whereas the barrier metal film and the W film are formed by deposition, using a sputtering process. The gate electrode 6 operates as a word line (WL). Thereafter, the gate electrode 6 is subjected to a wet hydrogen oxidation process to form a thin silicon oxide film on the wall side of n-type polycrystalline silicon file constituted as the gate electrode. The wet hydrogen oxidation process allows to selectively form an oxide film exclusive on silicon.

Figure 4:
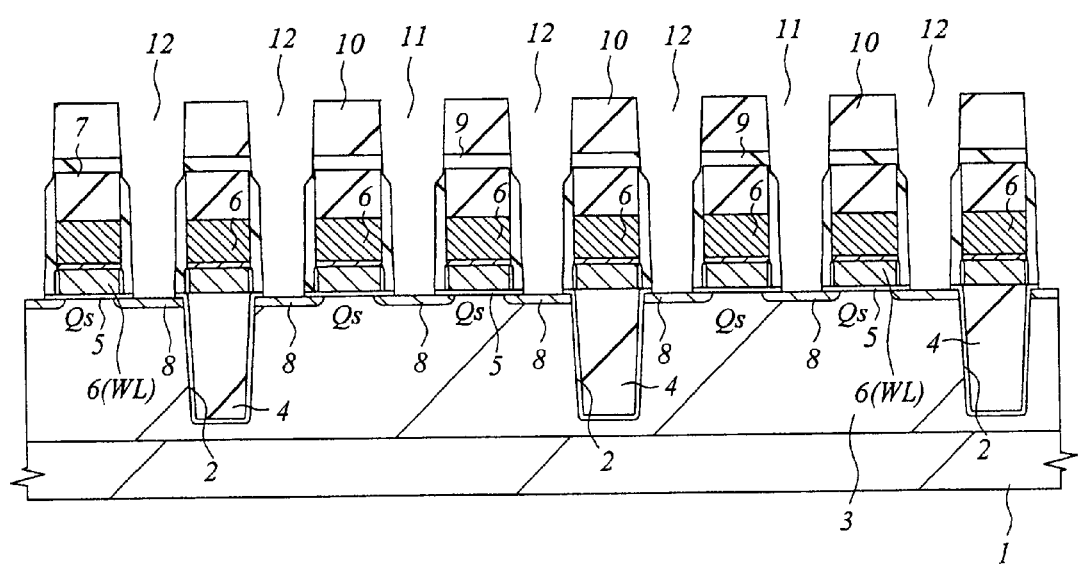
FIG. 4 is a schematic cross sectional view of a principal part of a semiconductor substrate, illustrating still another step of the first embodiment of process for manufacturing a semiconductor integrated circuit device according to the invention.

Then, as shown in FIG. 4, n-type semiconductor regions 8 (source/drain) are formed respectively at the opposite sides of the gate electrode 6 by implanting As (arsenal) or P (phosphor) in the p-type well 3. The MISFET Qs for memory cell selection are substantially completed by the above described steps.

Thereafter, a pair of contact holes 11, 12 are formed for each element on the n-type semiconductor regions 8 (source/drain) of the MISFET Qs for memory cell selection by depositing a silicon nitride film 9 (about 50 nm thick) and a silicon oxide film 10 (about 600 nm thick) on the semiconductor substrate 1 by CVD, flattening the surface of the silicon oxide film 10 by means of a chemical mechanical polishing technique and dry-etching the silicon oxide film 10 and the silicon nitride film 9, using a photoresist film (not shown) as mask. The operation of etching the silicon oxide film 10 is conducted with a large selective ratio relative to the silicon nitride film, whereas that of etching the silicon nitride film 9 is conducted with a large selective ratio relative to silicon and the silicon oxide film. As a result, the contact holes 11, 12 are formed to be self-aligned relative to the gate electrode 6 (word line).

Figure 5:
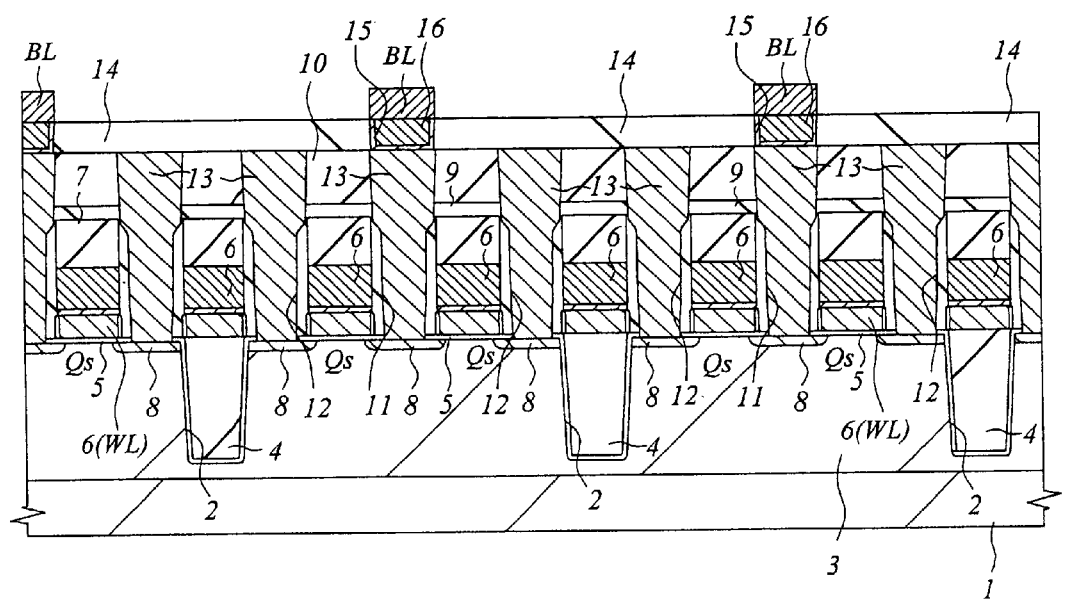
FIG. 5 is a schematic cross sectional view of a principal part of a semiconductor substrate, illustrating still another step of the first embodiment of process for manufacturing a semiconductor integrated circuit device according to the invention.

Then, as shown in FIG. 5, a plug 13 is formed in each of the contact holes 11, 12 by depositing an n-type polycrystalline silicon film that is doped with P on the silicon oxide film 10 by means of CVD to bury the n-type polycrystalline silicon film in the contact holes 11, 12 and subsequently removing the n-type polycrystalline silicon film from the outside of the contact holes 11, 12 by chemical mechanical polishing (or by an etching back technique).

Then, after depositing a silicon oxide film 14 (about 150 nm thick) on the silicon oxide film 10 by CVD, a through hole 15 is formed by dry-etching the silicon oxide film 14 on the contact hole 11.

Then, a plug 16 is formed in the through hole 15 by depositing a barrier metal film that is a laminated film comprising a Ti film and TiN film formed on the silicon oxide film 14, subsequently depositing a W film on the barrier metal film by CVD to bury the films in the through hole 15 and then removing the films outside of the through hole 15 by chemical mechanical polishing. Thereafter, the n-type semiconductor regions (source/drain) of the MISFET Qs for memory cell selection and the bit line BL which will be described hereinafter are connected by way of the plugs 16 and 13.

Then, a bit line BL is formed on the silicon oxide film 14 and the plug 16 by depositing a TiN film (about 10 nm thick, not shown) on the silicon oxide film 14 by sputtering, subsequently depositing a W film (about 50 nm thick) on the TiN film by CVD and dry-etching these films, using a photoresist film (not shown) as mask.

Figure 6:
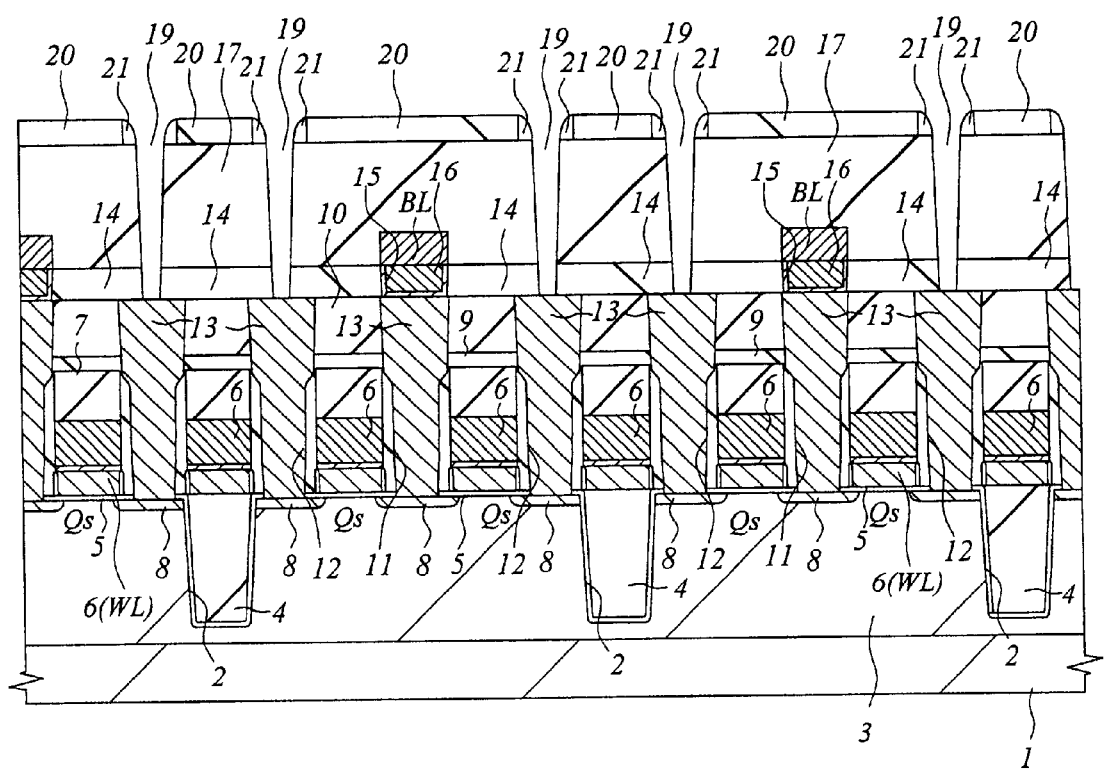
FIG. 6 is a schematic cross sectional view of a principal part of a semiconductor substrate, illustrating still another step of the first embodiment of process for manufacturing a semiconductor integrated circuit device according to the invention.

Then, as shown in FIG. 6, a silicon oxide film 17 (about 300 nm thick) is formed on the bit line BL by CVD and then the surface of the film 17 is flattened by chemical mechanical polishing. Thereafter, a through hole 19 is formed on each of the contact hole 12 containing the plug 13 buried therein by dry-etching the silicon oxide film 17.

The through hole 19 is made to show a diameter smaller than that of the underlying contact hole 12. More specifically, the through hole 19 is formed in a manner as described below. Firstly, a polycrystalline silicon film 20 is deposited on the silicon nitride film 18 by CVD and then a hole is formed by dry-etching the polycrystalline silicon film 20 in the region for producing the through hole 19. Then, another polycrystalline silicon film (not shown) is formed on the polycrystalline silicon film 20. Subsequently, side wall spacers 21 are formed on the side walls of the hole by anisotropically etching the polycrystalline silicon film on the polycrystalline silicon film 20 and then the silicon nitride film 18 and the silicon oxide film 17 are dry-etched from the bottom of the hole by using the polycrystalline silicon film 20 and the side wall spacers 21 as hard mask.

Figure 7:
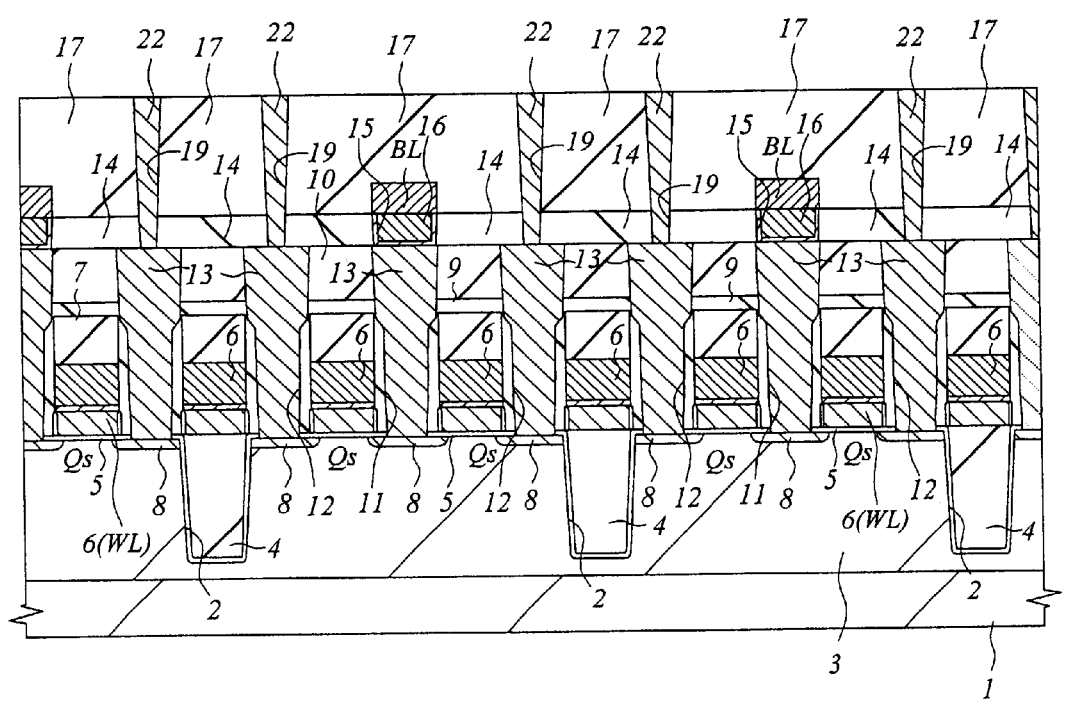
FIG. 7 is a schematic cross sectional view of a principal part of a semiconductor substrate, illustrating still another step of the first embodiment of process for manufacturing a semiconductor integrated circuit device according to the invention.

Then, the polycrystalline silicon film 20 and the side wall spacers 21 are removed by dry-etching and a plug 22 is formed in the through hole 19 as shown in FIG. 7. For forming the plug 22, an n-type polycrystalline selection film is buried in the inside of the through hole 19 by depositing an n-type polycrystalline silicon film that is doped with P on the silicon nitride film 18 by CVD and subsequently the n-type polycrystalline silicon film outside of the through hole 19 is removed by chemical mechanical polishing (or by etching back).

Subsequently, an information storage capacity element C is formed on the plug 22. The element C comprises a lower electrode 30 comprising Ru films 30a, 30d, a capacitor insulating film made of a tantalum oxide film 32 and an upper electrode 33 made of W film/Ru film The process of forming the information storage capacity element C will be described in greater detail by referring to FIGS. 8 through 17. The drawings schematically illustrate the region for forming an information storage capacity element C located on the plug 22.

Figure 8:
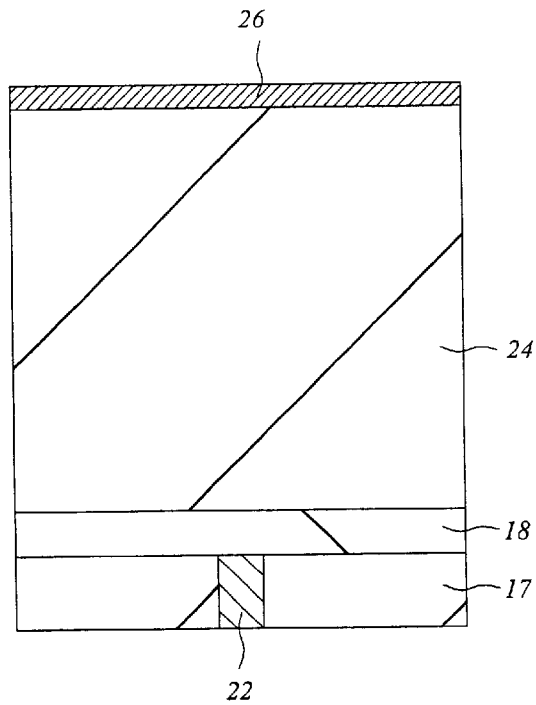
FIG. 8 is a schematic cross sectional view of a principal part of a semiconductor substrate, illustrating still another step of the first embodiment of process for manufacturing a semiconductor integrated circuit device according to the invention.

Firstly, referring to FIG. 8, a silicon nitride film 18 is deposited on the plug 22 and the silicon oxide film 17 with a film thickness of about 50 nm by CVD and subsequently a silicon oxide film 24 is deposited on the silicon nitride film 18. The lower electrode of the information storage capacity element C is formed in the hole (recess) of the silicon oxide film 24 that is produced in the next step. The silicon oxide film 24 needs to be deposited to show a large thickness (about 0.8 $\mu$m) in order to make the lower electrode have a large surface area and show a large stored charge. The silicon oxide film 24 is typically deposited by plasma CVD, using a mixture of oxygen and tetraethoxysilane (TEOS) as source gas and subsequently the surface thereof is flattened by chemical mechanical polishing, if necessary.

Then, a hard mask 26 that is made of a tungsten film is formed on the silicon oxide film 24. The hard mask 26 may be made of metal other than tungsten.

Figure 9:
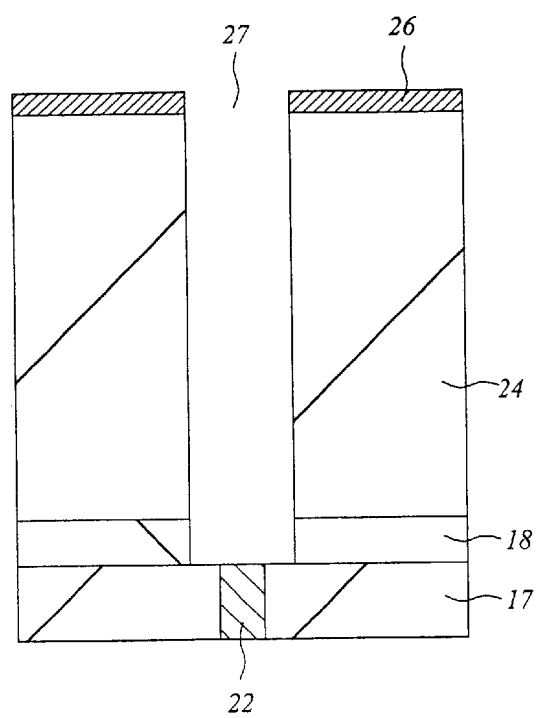
FIG. 9 is a schematic cross sectional view of a principal part of a semiconductor substrate, illustrating still another step of the first embodiment of process for manufacturing a semiconductor integrated circuit device according to the invention.

Thereafter, as shown in FIG. 9, a photoresist film (not shown) is formed on the hard mask 26 and the hard mask 26 is dry-etched by using the photoresist film as mask. Subsequently, a deep hole (recess) 27 is formed by dry-etching the silicon oxide film 24 and the silicon nitride film 18, using the hard mask 26 as a mask. The surface of the plug 22 in the through hole 19 is exposed through the bottom of the deep hole (recess) 27.

Figure 10:
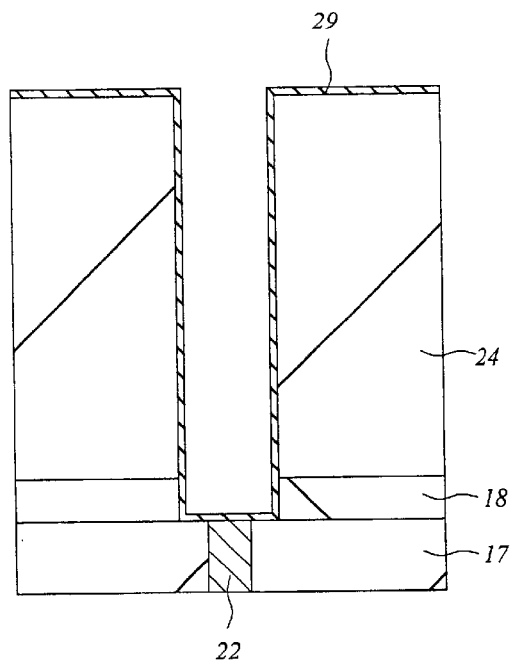
FIG. 10 is a schematic cross sectional view of a principal part of a semiconductor substrate, illustrating still another step of the first embodiment of process for manufacturing a semiconductor integrated circuit device according to the invention.

Then, the hard mask 26 remaining on the silicon oxide film 24 is removed by means of a solution containing hydrogen peroxide and an tantalum oxide film 29 (about 10 nm thick) is deposited on the silicon oxide film 24 and in the hole 27 by CVD as shown in FIG. 10. Such a tantalum oxide film can be formed by using $Ta(OC_2H_5)_5$ and $O_2$ as source gas at temperature between 400 and 450° C. The tantalum oxide film 29 is highly adhesive relative to the underlying silicon oxide film 24 and also to the Ru films 30 (30a, 30d) which will be described hereinafter so that it is used to operate as adhesive layer. A tantalum nitride film may alternatively be used as adhesive layer.

Figure 11:
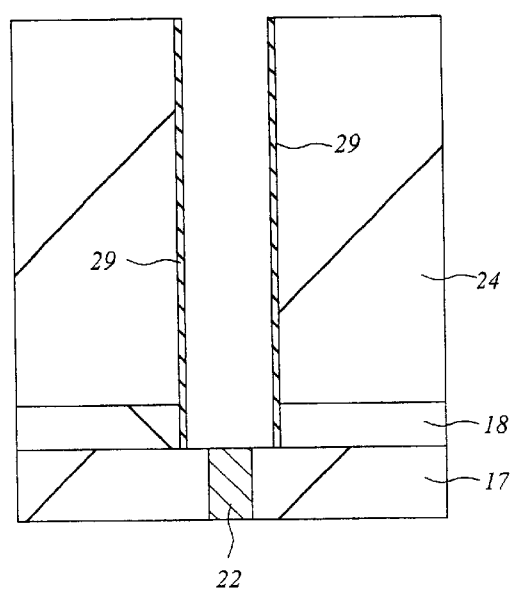
FIG. 11 is a schematic cross sectional view of a principal part of a semiconductor substrate, illustrating still another step of the first embodiment of process for manufacturing a semiconductor integrated circuit device according to the invention.

Thereafter, as shown in FIG. 11, the tantalum oxide film 29 on the silicon oxide film 24 and the bottom of the hole 27 is removed by anisotropically etching it. Thus, the tantalum oxide film 29 is left only on the side wall of the hole 27. If a tantalum nitride film is used as adhesive layer, the tantalum nitride film on the bottom of the hole 27 does not need to be removed because it is electrically conductive.

Figure 12:
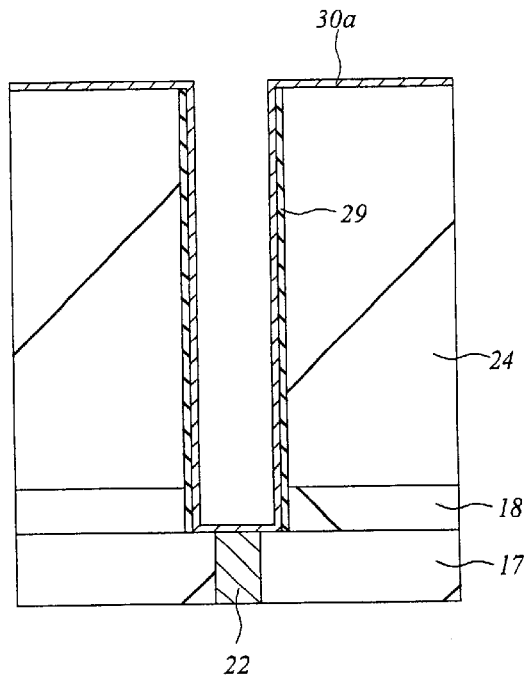
FIG. 12 is a schematic cross sectional view of a principal part of a semiconductor substrate, illustrating still another step of the first embodiment of process for manufacturing a semiconductor integrated circuit device according to the invention.

Then, as shown in FIG. 12, an Ru film 30 (about 5 nm thick) is deposited on the silicon oxide film 24 and in the hole 27 by CVD. Note that the Ru film can be formed efficiently by CVD when a thin Ru film is formed by sputtering before depositing the Ru film by CVD because the film formed by sputtering operates as seed.

Now, the requirements that need to be met when forming the Ru film 30a will be discussed below. The Ru film 30a is typically formed by CVD, introducing a tetrahydrofuran solution of ethylcyclopentadieneruthenium $(Ru(C_2H_5C_5H_4)_2)$, $O_2$ and $N_2$ at respective rates of 5 $cm^3$/min, 50 $cm^3$/min (the volume as used herein is expressed in terms of the value under standard conditions (at 0° C. under 1 atmospheric pressure($1.01325\times10^5$ Pa)) and expressed by using "sccm" hereinafter) and 900 "sccm" at 290° C. under the pressure of 665 Pa. When the film is formed under these conditions, the ratio (b/a (%)) of the smallest film thickness "b" that is found on the bottom of the deep groove to the largest film thickness "a" of the Ru film formed on the side wall and the bottom of the hole, can be held to not less than 50%.

Figure 18A:
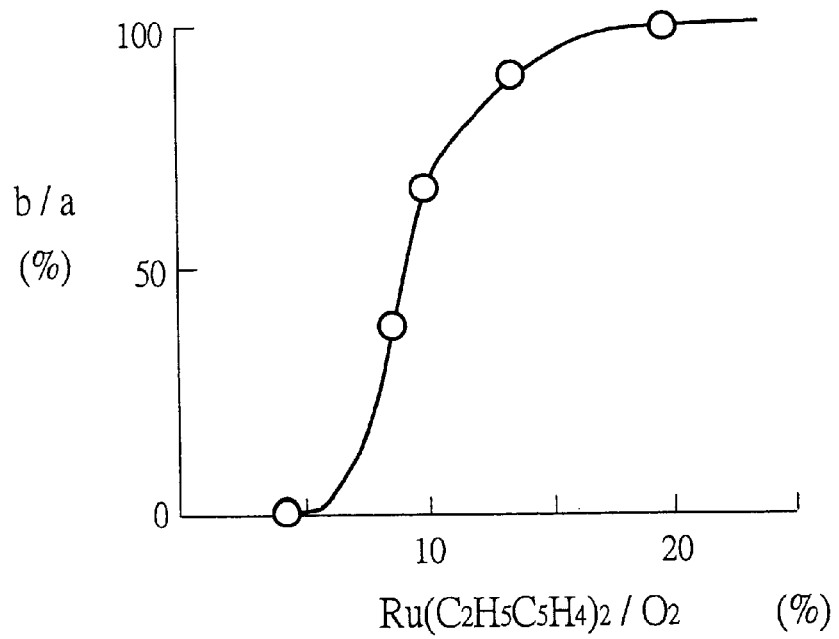
FIG. 18A is a graph showing the coating effect (b/a) of the present invention and FIG. 18B is a schematic illustration of the coating effect (b/a) of the present invention.

FIG. 18A is a graph showing the relationship between the coating effect and the ratio of the flow rates of the raw materials $(Ru(C_2H_5C_5H_4)_2/O_2)$ that can be observed when forming an Ru film in a deep hole by CVD. The expression of coating effect as used herein refers to the ratio of the smallest film thickness "b" that is found on the bottom of the deep groove to the largest film thickness "a" (b/a (%)) of the Ru film formed on the side wall and the bottom of the hole. The ratio of the flow rates of the raw materials $(Ru(C_2H_5C_5H_4)_2/O_2)$ as used herein refers to the ratio of the volume of the gaseous raw material of $Ru(C_2H_5C_5H_4)_2$ that is originally liquid and gasified in a gasifier to the volume of $O_2$ (gas flow rate ratio). The deep hole has a diameter of 250 nm and a depth of 1,500 nm (depth/diameter=6). The $O_2$ flow rate is made equal to 50 sccm.

As seen from FIG. 18A, the coating effect is very poor and no Ru film is formed on the bottom of the deep hole when the flow rate ratio is less than 5%. An Ru film starts forming on the deep hole bottom when the flow rate ratio exceeds 5%. The coating effect remarkably improves to go over 50% when the flow rate ratio exceeds 10%. Finally, the coating effect becomes practically equal to 100% when the flow rate ratio exceeds 20%.

Therefore, when an Ru film is formed by introducing a tetrahydrofuran solution (0.1 mol/lit.) of ethylcyclopentadieneruthenium $(Ru(C_2H_5C_5H_4)_2)$, $O_2$ and $N_2$ at respective rates of 5 $cm^3$/min, 50 sccm and 900 sccm, the ethylcyclopentadieneruthenium solution is supplied at a rate of 0.0005 mol/min, which is equal to a gas supply rate of about 11 $cm^3$/min as calculated by means of the equation of state of gas or PV=nRT (P: pressure (atm), V: volume (lit.), n: number of mols (mol), R: gas constant (0.082), T: absolute temperature (K)) when the conditions are reduced to 1 atmospheric pressure ($1.01325\times10^5$ Pa) and 273K. Thus, the flow rate ratio is about 22%, signifying a coating effect of about 100%.

Figure 18B:
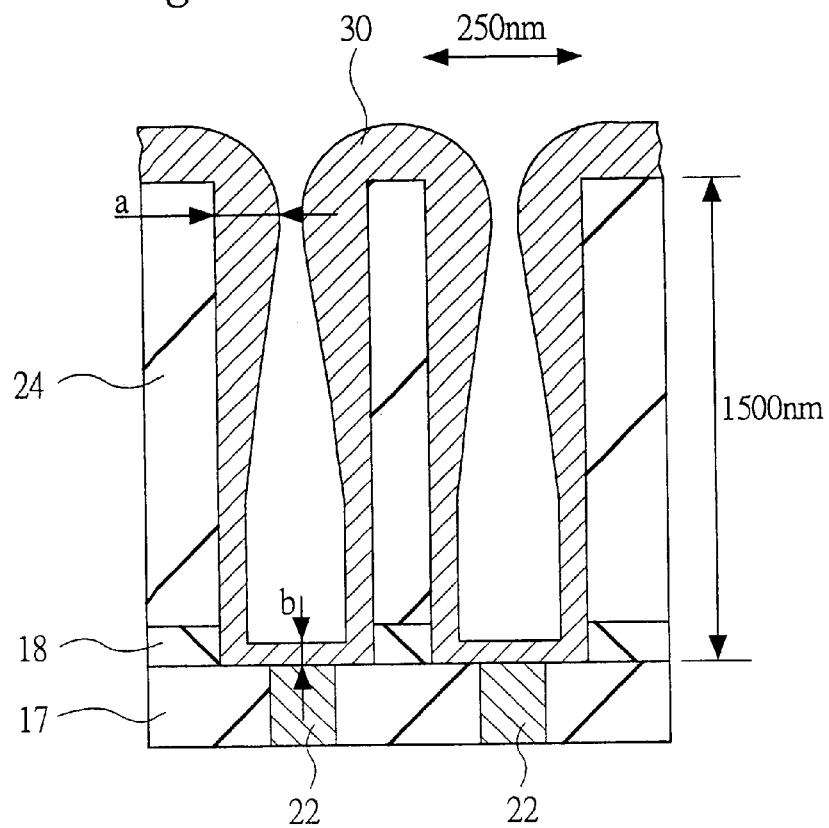

While the flow rate of $O_2$ is 50 sccm in FIG. 18, the flow rate of the supplied oxygen gas is not limited thereto and oxygen gas may well be supplied at rate that is sufficient for decomposing the organic groups of $Ru(C_2H_5C_5H_4)_2$. More specifically, under the above listed conditions, the organic groups of $Ru(C_2H_5C_5H_4)_2$ can be decomposed when oxygen gas is supplied at a rate of about 10 sccm. While the film forming temperature is 290° C. in the above description, any appropriate temperature may be selected below 300° C.

As a flow rate ratio of $Ru(C_2H_5C_5H_4)_2/O_2$ not less than 10% is selected for this embodiment, the film thickness of the Ru film on the bottom of the deep hole is not less than 50% of the largest film thickness "a" of the Ru film.

Figure 13:
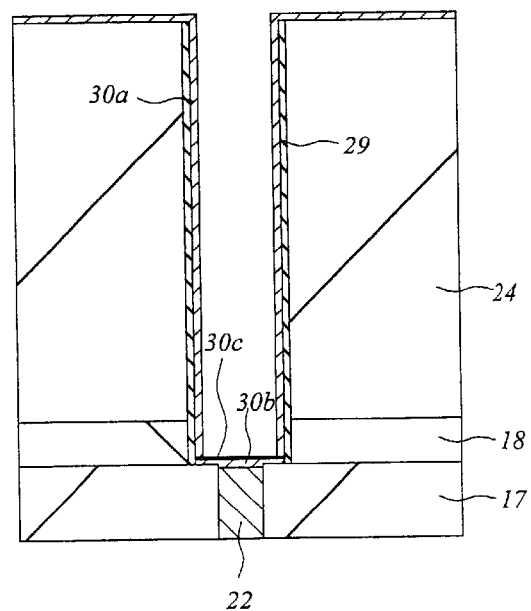
FIG. 13 is a schematic cross sectional view of a principal part of a semiconductor substrate, illustrating still another step of the first embodiment of process for manufacturing a semiconductor integrated circuit device according to the invention.

Then, as shown in FIG. 13, the work is subjected to a heat treatment process at 600° C. for one minute in a non-oxidizing atmosphere. As a result of this heat treatment, a silicide reaction occurs in the contact area of the plug 22 and the Ru film 30 to produce ruthenium silicide 30b on the bottom of the hole 27. However, no silicidizing reaction takes place on the side wall and at the outside of the hole 27 and hence no ruthenium silicide is produced because no underlying silicon exists there. Thus, ruthenium silicide 30b can be formed in a self-aligning manner on the bottom surface of the hole 27.

Thereafter, the work is subjected to another heat treatment process at 700° C. for one minutes in an ammonia ($NH_3$) atmosphere to form ruthenium silicon nitride (RuSiN) 30c on the surface of the ruthenium silicide 30b. The RuSiN formed under the above conditions shows a film thickness of about 1 nm. The film thickness of the RuSiN film 30c can be produced by controlling the heat treatment temperature. The Ru film 30d to be formed thereon and the plug 22 will not be electrically connect to each other satisfactorily when the thickness of the RuSiN film is too large, whereas the Ru film 30d and the plug 22 will not be prevented from being silicidized when the thickness of the RuSiN film is too small. Therefore, it is desirable to make the thickness of the RuSiN film between 0.5 and 1.0 nm in order to secure the electric connection of the Ru film 30d and the plug 22 and suppress the silicidizing reaction.

Figure 14:
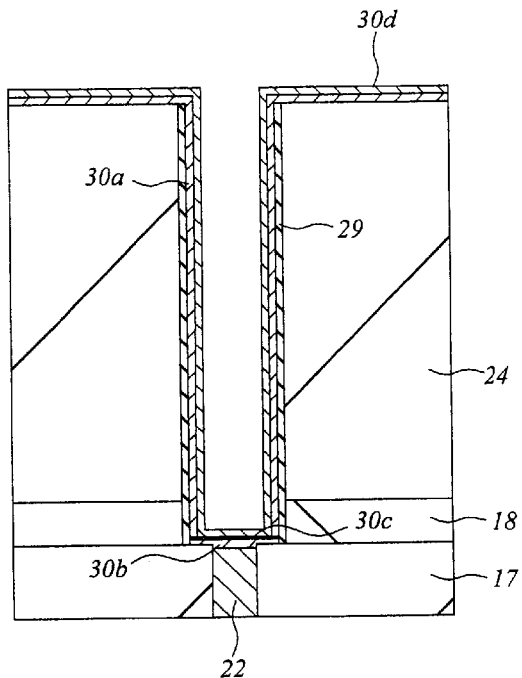
FIG. 14 is a schematic cross sectional view of a principal part of a semiconductor substrate, illustrating still another step of the first embodiment of process for manufacturing a semiconductor integrated circuit device according to the invention.

Then, as shown in FIG. 14, an about 20 nm thick Ru film 30d is formed on the Ru film 30a and the RuSiN film 30c by CVD, introducing a tetrahydrofuran solution of ethylcyclopentadieneruthenium ($Ru(C_2H_5C_5H_4)_2$), $O_2$ and $N_2$ at respective rates of 5 cm$^3$/min, 50 sccm and 900 sccm at 290° C. under the pressure of 665 Pa.

As a flow rate ratio of $Ru(C_2H_5C_5H_4)_2/O_2$ not less than 10% is selected for forming the Ru film 30d, the film thickness of the Ru film on the bottom of the deep hole can be secured to be not less than 50% of the largest film thickness of the Ru film.

As a flow rate ratio of $Ru(C_2H_5C_5H_4)_2/O_2$ not less than 10% is selected for forming the Ru film 30d, the film thickness of the Ru film on the bottom of the deep hole is not less than 50% of the largest film thickness of the Ru film as in the case of forming the Ru film 30a. Thus, it is possible to uniformly produce the Ru films 30a, 30d in a deep hole. As a result, the undulations of the Ru films can be reduced (to less than 5 nm).

Figure 15:
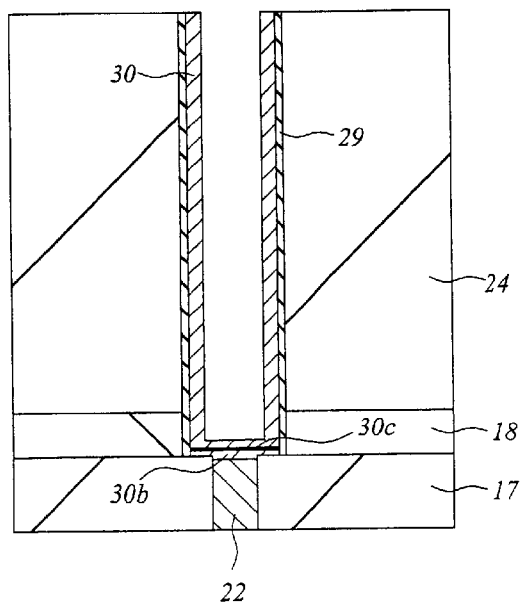
FIG. 15 is a schematic cross sectional view of a principal part of a semiconductor substrate, illustrating another step of the first embodiment of process for manufacturing a semiconductor integrated circuit device according to the invention.

Thereafter, photoresist (not shown) is applied onto the Ru film 30d. Then, the entire surface is exposed to light and developed so that the photoresist film (not shown) is left only in the hole 27. The photoresist film operates as protection film for preventing the Ru films 30a, 30d from being removed from the inside (the side all and the bottom) of the hole 27 when the unnecessary parts of the Ru films 30a, 30d are removed from the top of the silicon oxide film 24 by dry etching in the next step. Then, a lower electrode 30 is produced by removing the Ru films 30a, 30d on the silicon oxide film 24 by dry etching, using the photoresist film as mask. Subsequently, the photoresist film in the hole 27 is removed (FIG. 15).

Figure 16:
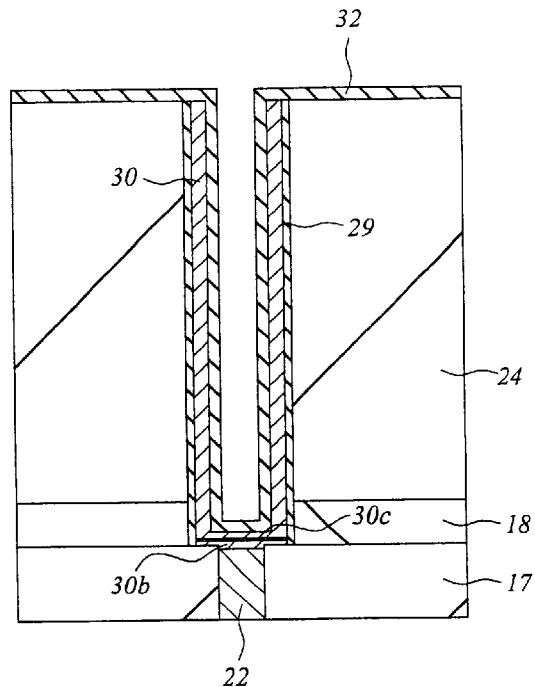
FIG. 16 is a schematic cross sectional view of a principal part of a semiconductor substrate, illustrating still another step of the first embodiment of process for manufacturing a semiconductor integrated circuit device according to the invention.

Then, as shown in FIG. 16, a tantalum oxide film 32 is deposited in the inside of the hole 27 where the lower electrode 30 is formed and on the silicon oxide film 24 and used as capacity insulating film by CVD to a thickness of about 15 nm.

Thereafter, the tantalum oxide film 32 is heat-treated at about 700° C. for two minutes in a nitrogen atmosphere to crystallize the tantalum oxide and then at about 550° C. for one minutes in an oxygen atmosphere to improve the film quality of the tantalum oxide film.

Figure 17:
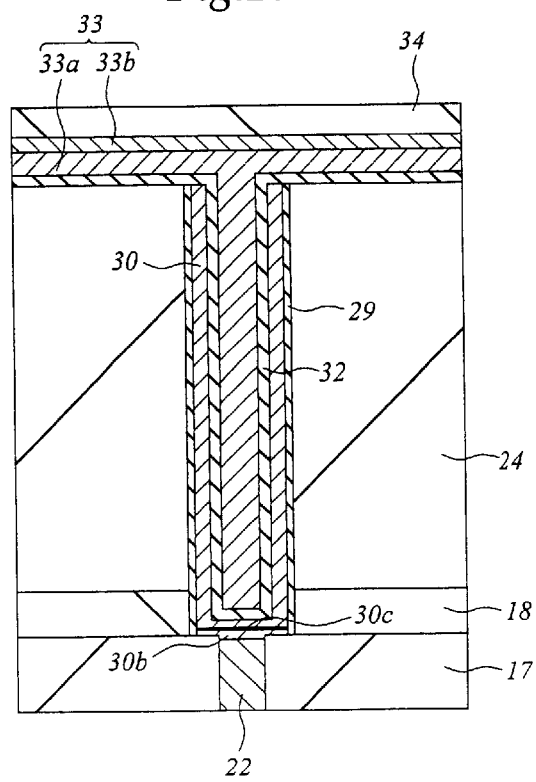
FIG. 17 is a schematic cross sectional view of a principal part of a semiconductor substrate, illustrating still another step of the first embodiment of process for manufacturing a semiconductor integrated circuit device according to the invention.

Then, as shown in FIG. 17, an upper electrode 33 is formed on the tantalum oxide film 32 by depositing an Ru film 33a (about 70 nm thick) and a W film 33b (about 100 nm thick) by CVD on the tantalum oxide film 32. The W film is used to reduce the contact resistance between the upper electrode 33 and the upper wiring. Additionally, a TiN film may be formed between the Ru film and the W film in order to prevent any increase of resistance due to diffusion of gas (oxygen and/or hydrogen) from the capacity insulating film (tantalum oxide film 32) into the W film.

Figure 19:
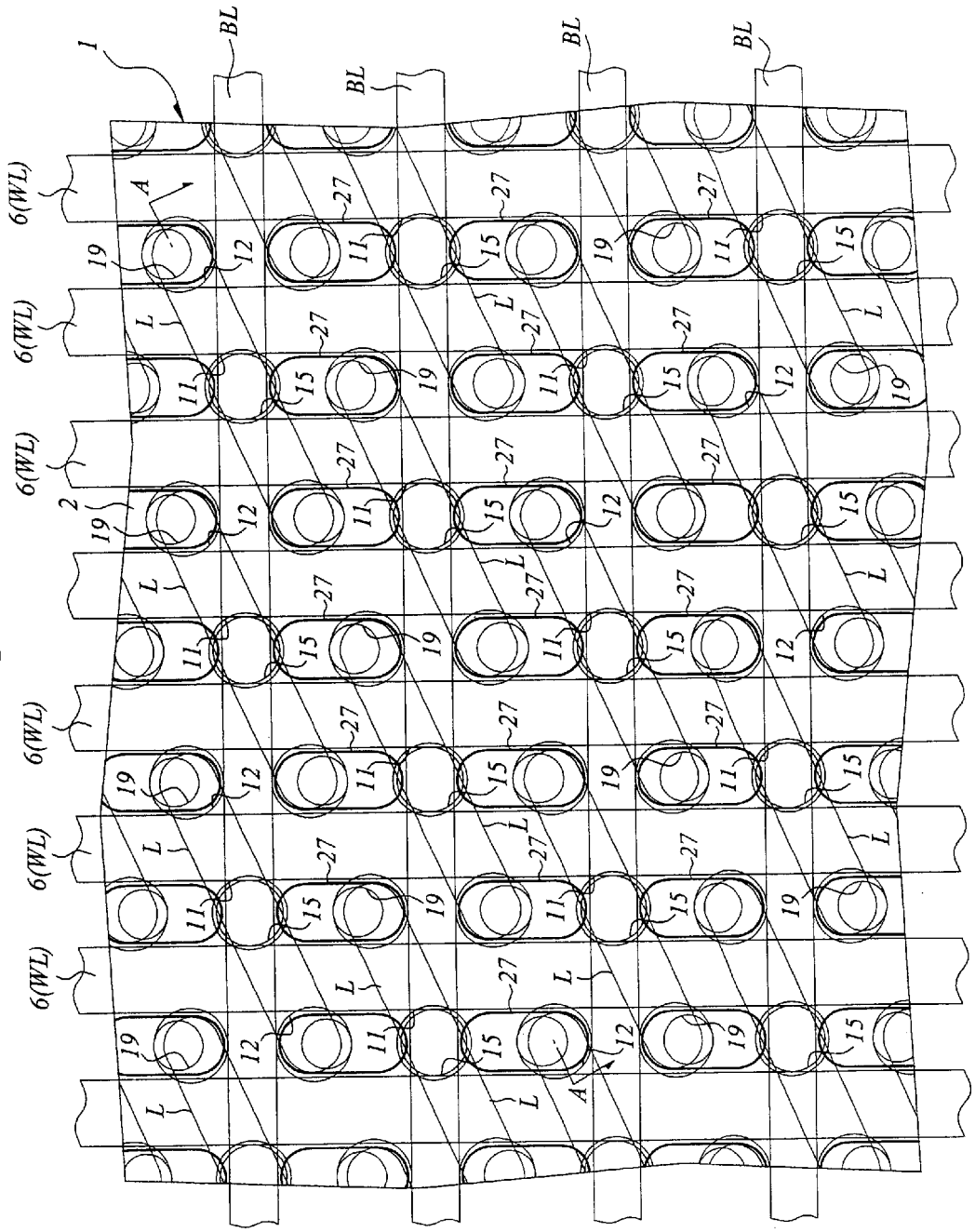
FIG. 19 is a schematic plan view of a principal part of a semiconductor substrate, also illustrating the first embodiment of process for manufacturing a semiconductor integrated circuit device according to the invention.

Thus a complete information storage capacity element C comprising a lower electrode 30 formed by the Ru films 30a, 30d, a capacity insulating film formed by the tantalum oxide film 32 and an upper electrode 33 formed by a W film 33b and an Ru film 33b is produced as a result of the above described steps so that the process of forming memory cells of a DRAM comprising MISFET Qs for memory cell selection and information storage capacity elements C connected to them in series is substantially completed. FIG. 19 is a schematic plan view of a semiconductor integrated circuit device after forming information storage capacity elements C. It will be appreciated that FIG. 7 is a cross sectional view taken along line A—A in FIG. 19.

Thereafter, an interlayer insulating film 34 which may typically be a silicon oxide film is formed on the information storage capacity elements C.

Then, although not shown, Al wires are arranged normally in two layers on the interlayer insulating film and a passivation film is formed on the top Al wiring layer.

As described above in detail, with this embodiment, it is possible to etch Ru films at an enhanced rate with a large selective ratio relative to resist. Therefore, it is possible to form lower electrodes of information storage capacity elements in respective holes showing a high aspect ratio at a high yield.

(Embodiment 2)

While the ruthenium silicon nitride (RuSiN) 30c is formed as barrier layer on the plug 22 after forming a deep hole 27 in the above described first embodiment, a barrier layer typically made of tantalum nitride or titanium nitride may be formed before forming the deep hole 27.

Figure 20:
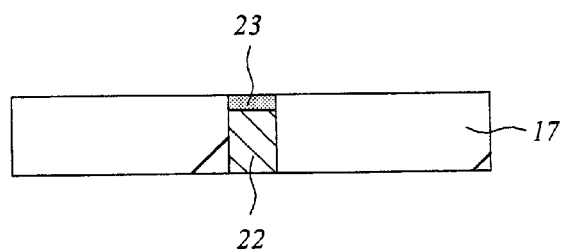
FIG. 20 is a schematic cross sectional view of a principal part of a semiconductor substrate, illustrating a step of the second embodiment of process for manufacturing a semiconductor integrated circuit device according to the invention.

FIG. 20 is a schematic illustration of an area where an information storage capacity element C is to be formed on a plug 22. The steps down to the formation of the plug 22 of this embodiment are same as those of the first embodiment described above by referring to FIGS. 1 through 7 and hence will not be described here any further.

With the second embodiment, a barrier metal film 23 is formed on the plug 22. More specifically, the barrier metal film 23 is formed firstly by making the surface of the plug 22 retreat to a level lower than the surface of the silicon nitride film 18 by etching to secure a space for burying the barrier metal film 23 on the plug 22. Then, a TiN film is buried in the above space on the plug 22 by depositing the TiN film on the silicon oxide film 17 by sputtering and subsequently the TiN film is removed from the outside of the space by chemical mechanical polishing (or etching back). Note that the space may alternatively be secured by over-polishing (over-etching) the n-type polycrystalline silicon film inside the through hole 19 at the time of forming the plug 22, where the n-type polycrystalline silicon film is buried in the inside of the through hole 19 by deposing the film that is doped with P on the silicon oxide film 17 and subsequently the n-type polycrystalline silicon film is removed from the outside of the through hole 19 by chemical mechanical polishing (or etching back).

Figure 21:
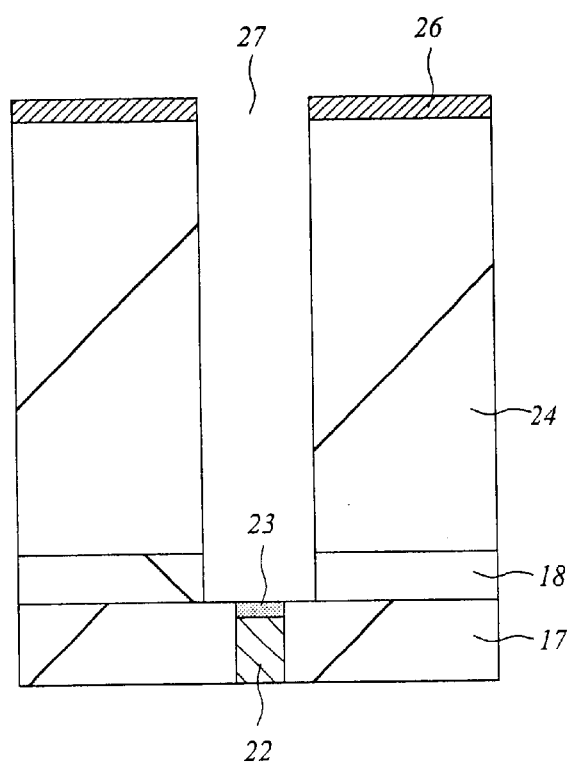
FIG. 21 is a schematic cross sectional view of a principal part of a semiconductor substrate, illustrating another step of the second embodiment of process for manufacturing a semiconductor integrated circuit device according to the invention.
Figure 22:
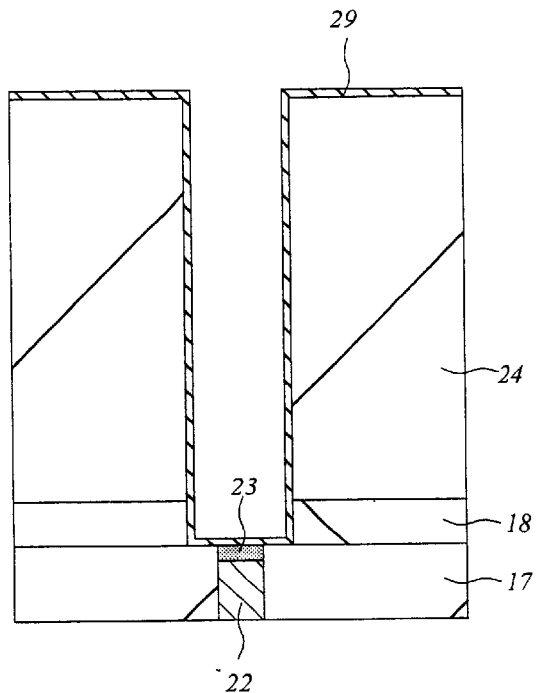
FIG. 22 is a schematic cross sectional view of a principal part of a semiconductor substrate, illustrating still another step of the second embodiment of process for manufacturing a semiconductor integrated circuit device according to the invention.

Then, as shown in FIG. 21, an about 50 nm thick silicon nitride film 18 is deposited on the plug 22 and the silicon oxide film 17 by CVD and subsequently a silicon oxide film 24 is deposited on the silicon nitride film 18. The lower electrode of the information storage capacity element C is formed in the inside of the hole (recess) that is formed in the silicon oxide film 24 in the next step. For the electrode to show a large surface area in order to increase the stored charge, it is necessary to make the silicon oxide film 24 have a large film thickness (about 0.8 μm). The silicon oxide film 24 can be formed by means of a plasma CVD process, using oxygen and tetraethoxysilane (TEOS) as source gas. If necessary, subsequently the surface is flattened by chemical mechanical polishing.

Thereafter, a hard mask 26 made of a tungsten film is formed on the silicon oxide film 24, although the hard mask 26 may alternatively be made of metal other than tungsten.

Subsequently, a phororesist film (not shown) is formed on the hard mask 26, which is then subjected to a dry etching operation, using the photoresist film as mask. Thereafter, both the silicon oxide film 24 and the silicon nitride film 18 are subjected to a dry etching operation, using the hard mask 26, to produce a deep hole (recess) 27. The surface of the barrier metal film 23 on the plug 22 is exposed through the bottom of the deep hole (recess) 27.

Then, after removing the hard mask 26 remaining on the silicon oxide film 24 by means of a solution containing hydrogen peroxide, a tantalum oxide film 29 (about 10 nm thick) is deposed on the silicon oxide film 24 and in the inside of the hole 27 by CVD, using $Ta(OC_2H_5)_5$ and $O_2$ as source gas at temperature between 400 and 450° C. The tantalum oxide film 29 is highly adhesive relative to the underlying silicon oxide film 24 and also to the Ru films 30 which will be described hereinafter so that it is used to operate as adhesive layer. A tantalum nitride film may alternatively be used as adhesive layer.

Figure 23:
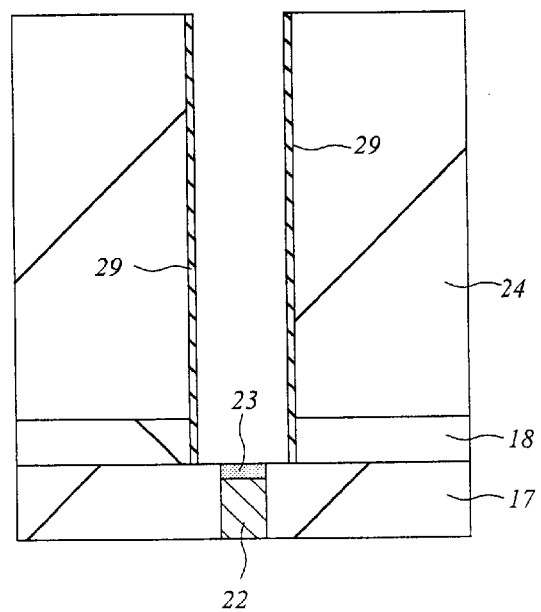
FIG. 23 is a schematic cross sectional view of a principal part of a semiconductor substrate, illustrating still another step of the second embodiment of process for manufacturing a semiconductor integrated circuit device according to the invention.

Thereafter, as shown in FIG. 23, the tantalum oxide film 29 on the silicon oxide film 24 and the bottom of the hole 27 is removed by anisotropically etching it. Thus, the tantalum oxide film 29 is left only on the side wall of the hole 27. If a tantalum nitride film is used as adhesive layer, the tantalum nitride film on the bottom of the hole 27 does not need to be removed because it is electrically conductive.

Figure 24:
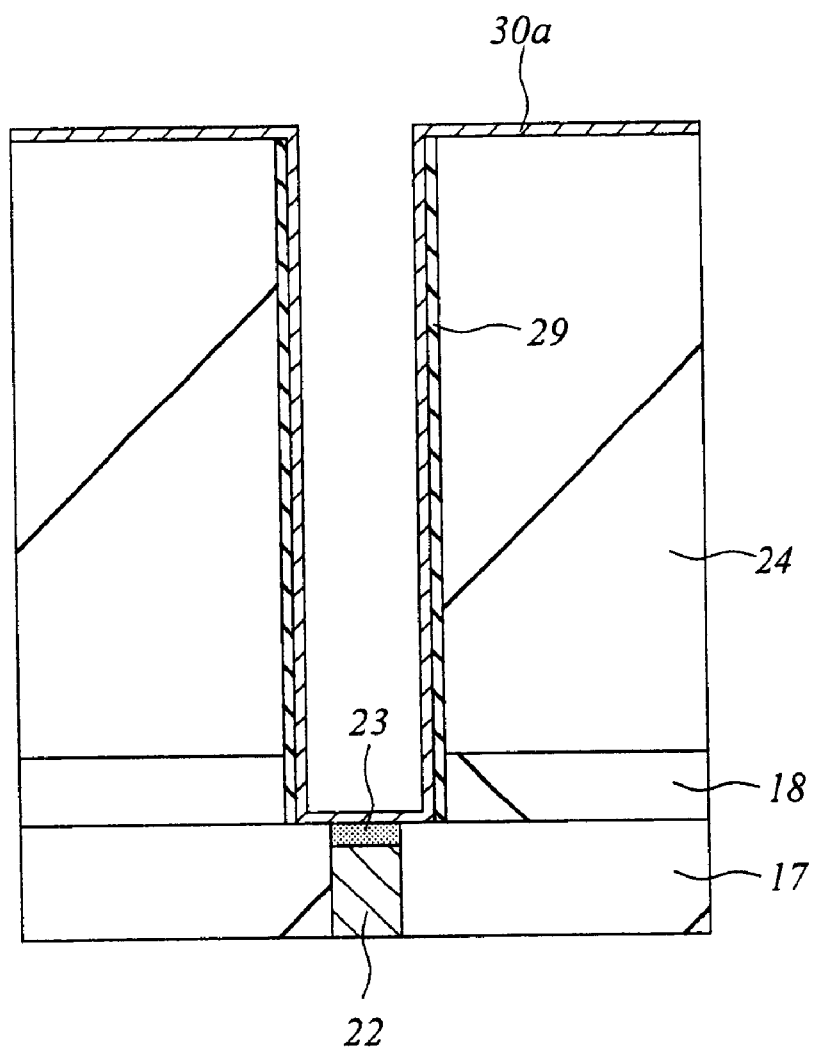
FIG. 24 is a schematic cross sectional view of a principal part of a semiconductor substrate, illustrating still another step of the second embodiment of process for manufacturing a semiconductor integrated circuit device according to the invention.
Figure 25A:
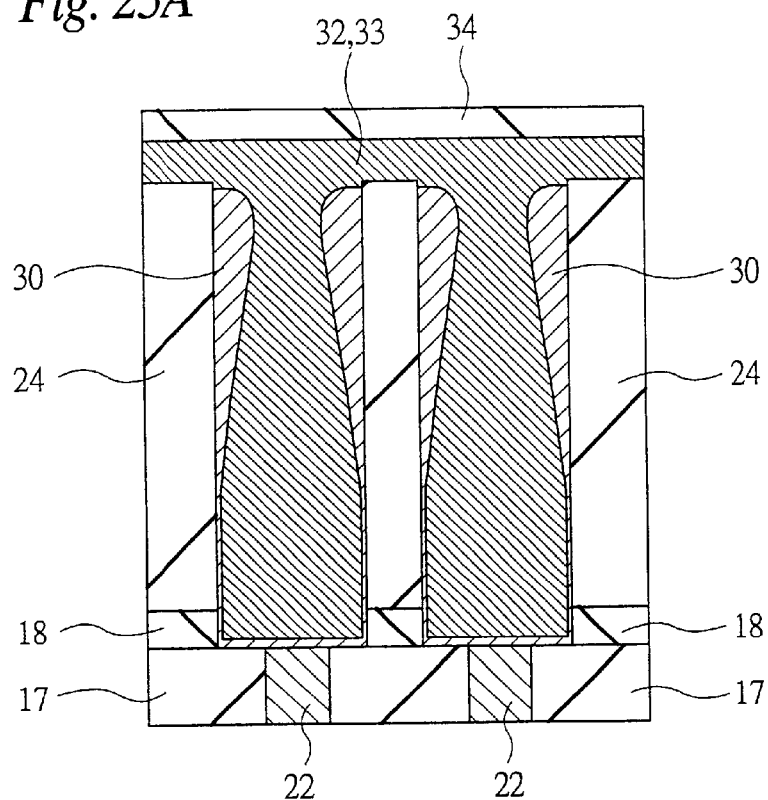
FIG. 25A is a schematic cross sectional views of a principal part of a semiconductor substrate, illustrating a problem to be dissolved by the present invention
Figure 25B:
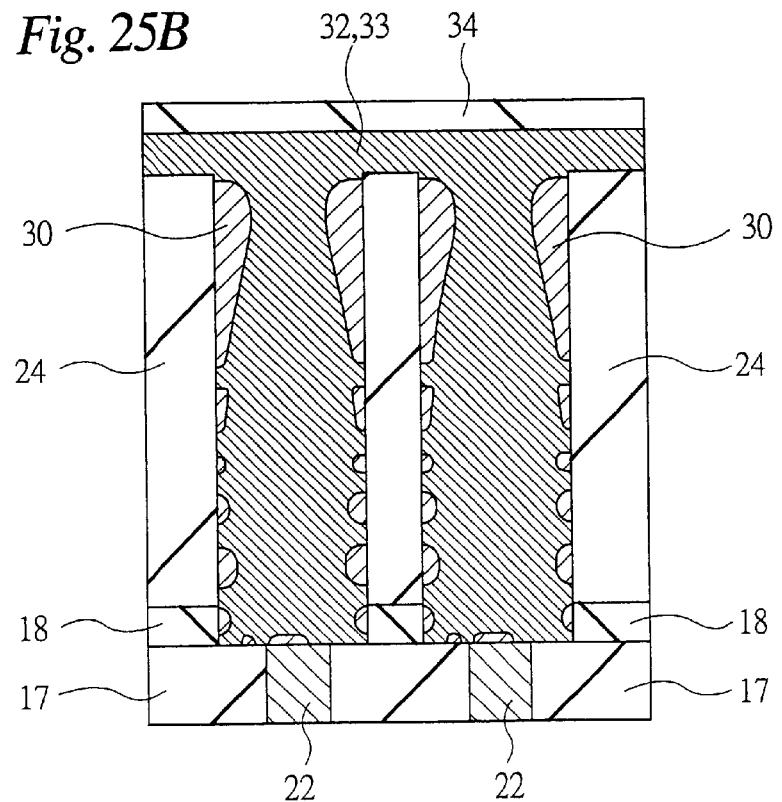
FIG. 25B is also a schematic cross sectional views of a principal part of a semiconductor substrate, illustrating a problem to be dissolved by the present invention.
Figure 26:
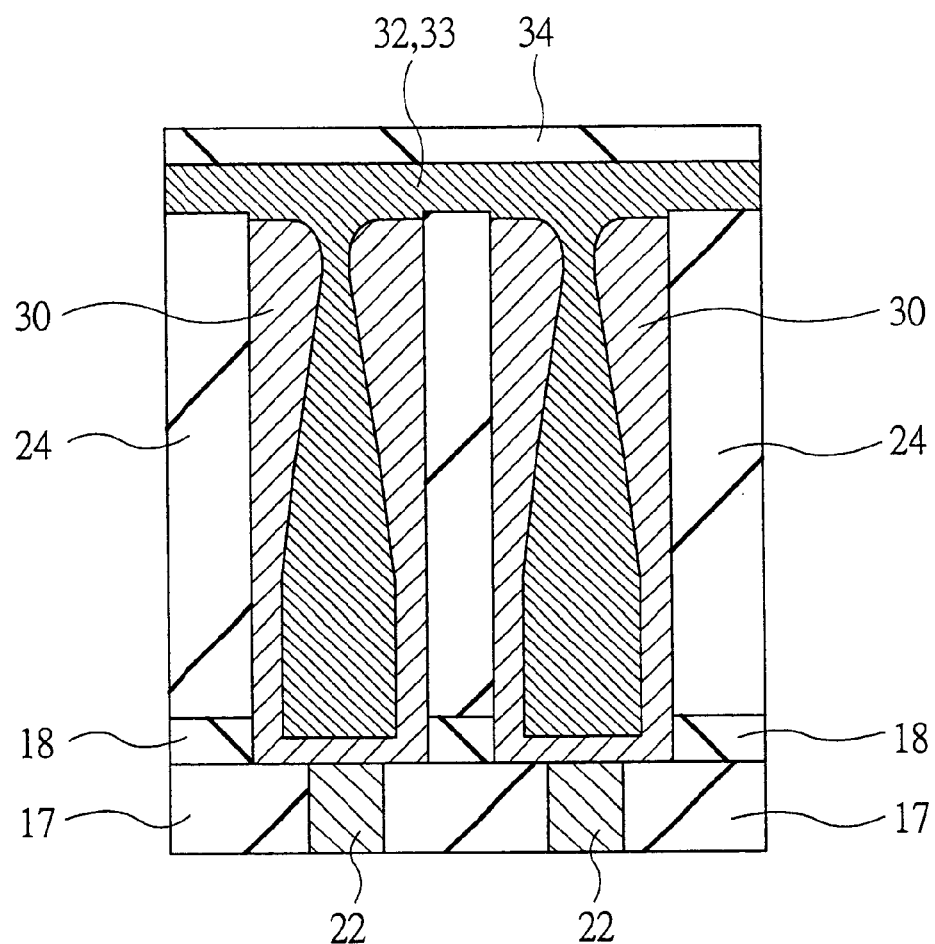
FIG. 26 is a schematic cross sectional view of a principal part of a semiconductor substrate, illustrating another problem to be dissolved by the present invention.

Then, as shown in FIG. 24, an Ru film 30a (about 20 nm thick) is deposited on the silicon oxide film 24 and in the hole 27 by CVD. Note that the Ru film can be formed efficiently by CVD when a thin Ru film is formed by sputtering before depositing the Ru film by CVD because the film formed by sputtering operates as seed.

Now, the requirements that need to be met when forming the Ru film 30a will be discussed below. The Ru film 30a is typically formed by CVD, introducing a tetrahydrofuran solution of ethylcyclopentadieneruthenium ($Ru(C_2H_5C_5H_4)_2$), $O_2$ and $N_2$ at respective rates of 5 cm³/min, 50 sccm and 900 sccm at 290° C. under the pressure of 665 Pa. When the film is formed under these conditions, the ratio (b/a) of the smallest film thickness "b" of the Ru film that is formed on the bottom of the hole 27 to the largest film thickness "a" of the Ru film formed on the side wall of the hole 27 can be held to not less than 50% as described earlier by referring to FIG. 18.

All the subsequent steps are same as their counterparts of Embodiment 1 described earlier by referring to FIGS. 16 and 17 and hence will not be described here any further.

The present invention is described in detail above specifically by referring to the preferred embodiments. However, the present invention is by no means limited to the described embodiments, which may be modified and/or altered in various different ways without departing from the scope of the present invention.

Some of the typical advantages of the present invention will be summarized below.

According to the invention, the conditions for forming Ru films can be optimized to produce excellent Ru films. For example, the ratio of the smallest film thickness that is found on the bottom of the deep groove to the largest film thickness "a" of the Ru film formed on the side wall and the bottom of the hole can be held to not less than 50% when the flow rate ratio is made greater than 10%.

As a result, the lower electrode of each information storage capacity element can be accurately formed in a deep hole to improve the performance of the element. Then, the yield of manufacturing semiconductor integrated circuit devices such as DRAMs can be improved.

What is claimed is:

1. A process for manufacturing a semiconductor integrated circuit device comprising:
   (a) a step of forming a MISFET for memory cell selection on a main surface of a semiconductor substrate;
   (b) a step of forming a plug electrically connected to a source/drain region of said MISFET for memory cell selection;
   (c) a step of forming a silicon oxide film over said plug;
   (d) a step of forming a hole getting to a surface of said plug in said silicon oxide film;
   (e) a step of forming an Ru film over a side wall and a bottom of said hole by causing an organic compound of Ru and an oxidizing agent, a gasification flow rate of the organic compound of Ru being not less than 5% of a flow rate of the oxidizing agent;
   (f) a step of forming a capacity insulating film over said Ru film; and
   (g) a step of forming an upper electrode on said capacity insulating film.

2. The method according to claim 1, wherein reaction of said organic compound of Ru and said oxidizing agent is conducted at temperature not higher than 300° C.

* * * * *